United States Patent
Kim

(10) Patent No.: US 7,335,567 B2
(45) Date of Patent: Feb. 26, 2008

(54) GATE ELECTRODES OF SEMICONDUCTOR DEVICES AND METHODS OF MANUFACTURING THE SAME

(75) Inventor: Kee-Yong Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 428 days.

(21) Appl. No.: 11/140,829

(22) Filed: May 31, 2005

(65) Prior Publication Data

US 2005/0266621 A1    Dec. 1, 2005

(51) Int. Cl.
*H01L 21/336* (2006.01)
(52) U.S. Cl. .............................. 438/304; 257/E21.621
(58) Field of Classification Search ................ 438/304, 438/596, 671; 257/E21.621

See application file for complete search history.

(56) References Cited

U.S. PATENT DOCUMENTS

| | | | | |
|---|---|---|---|---|
| 6,008,096 A | * | 12/1999 | Gardner et al. | 438/300 |
| 6,063,688 A | * | 5/2000 | Doyle et al. | 438/424 |
| 6,358,827 B1 | * | 3/2002 | Chen et al. | 438/304 |

* cited by examiner

*Primary Examiner*—Chandra Chaudhari
(74) *Attorney, Agent, or Firm*—Andrew D. Fortney

(57) ABSTRACT

Gate electrodes of semiconductor devices and methods of manufacturing the same are disclosed. An example method comprises: sequentially forming a gate oxide layer and a sacrificial buffer layer on a semiconductor substrate; patterning the sacrificial buffer layer to form an auxiliary pattern; depositing a polysilicon layer; dry etching the polysilicon layer to form a side wall of the polysilicon layer to adjacent the auxiliary pattern; removing the auxiliary pattern; depositing an insulating layer; chemical mechanical polishing to remove a predetermined thickness of the side wall and the insulating layer to thereby complete the gate electrode from the side wall; and removing the insulating layer.

4 Claims, 2 Drawing Sheets

GATE ELECTRODES OF SEMICONDUCTOR DEVICES AND METHODS OF MANUFACTURING THE SAME

FIELD OF THE DISCLOSURE

The present disclosure relates generally to semiconductor fabrication and, more particularly, to gate electrodes of semiconductor devices having a fine line width (e.g., nanoscale) and methods of manufacturing the same.

BACKGROUND

Generally, MOS transistors are categorized as field effect transistors (FETs). In such a MOS transistor, source and drain regions are formed in a semiconductor substrate. A gate oxide layer and a gate are then formed on the same semiconductor substrate. In such a MOS transistor, metal lines are connected to the electrodes of the source, the drain, and the gate, to receive electrical signals for operating the device.

In a manufacturing process of such a MOS transistor, a gate oxide layer and a polysilicon layer of a predetermined width are deposited on the surface of an active region of a silicon wafer. These layers are then patterned to form a gate electrode. Using the gate electrode as a doping mask, a P-type or N-type dopant is then implanted at a low concentration in a device region of the silicon wafer, such that a lightly doped drain (LDD) region is formed in the device region of the silicon wafer. After forming side walls on both lateral sides of the gate electrode, a dopant having the same conductivity type as the aforementioned LDD region is implanted in the device region of the silicon wafer using the side walls and the polysilicon as a doping mask.

As semiconductor devices have become more integrated, the line widths of the corresponding circuits have become narrower. Accordingly, the size of the gate has become smaller, and a so-called nanogate has been achieved.

However, a gate of a very small size, such as a nanogate, is very difficult to realize using a conventional method of manufacturing a semiconductor device due to the limited capability of a photolithography process for forming the gate.

Figure 1:
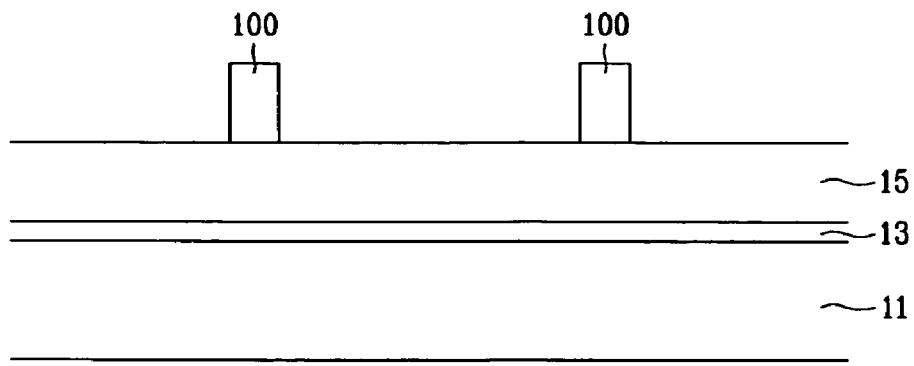
FIG. 1 to FIG. 6 are cross-sectional views illustrating sequential stages of forming a gate electrode of an example semiconductor device pursuant to an example method performed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

An example method of manufacturing a metal line for a gate electrode of an example semiconductor device will now be described in detail with reference to the drawings.

FIG. 1 to FIG. 6 are cross-sectional views illustrating the example method of forming the gate electrode of the example semiconductor device. First, as shown in FIG. 1, a predetermined region of a silicon wafer 11 is selectively etched to form a trench (not shown). An interior of the trench is filled with an oxide layer to form a field oxide layer (not shown), such that an entire region of the silicon wafer 11 (except the field oxide layer) may be defined as an active region of the device. Subsequently, a gate oxide layer 13 and a sacrificial oxide layer 15 are sequentially formed above the entire surface of the silicon wafer 11 including the field oxide layer. A photosensitive layer pattern 100 for side walls is formed above the sacrificial layer 15. In the illustrated example, a desired gate width can be achieved by adjusting a thickness of the sacrificial oxide layer 15, which is obvious to a person of ordinary skill in the art. The sacrificial oxide layer 15 may be replaced with a material having an etching selectivity with respect to polysilicon.

Figure 2:
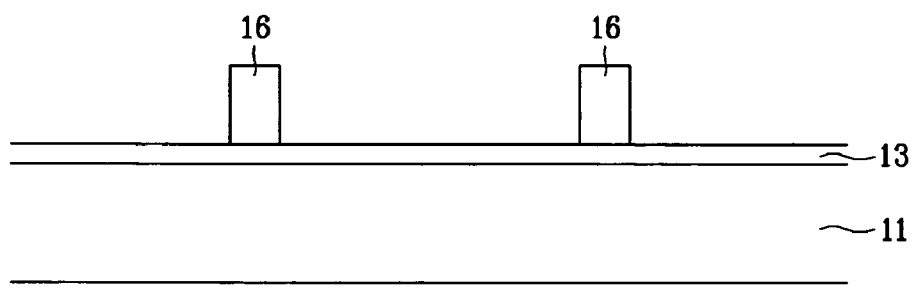

Subsequently, as shown in FIG. 2, the sacrificial oxide layer 15 is patterned while using the photosensitive layer pattern 100 as an etching mask to form an auxiliary pattern 16 for the side walls.

Figure 3:
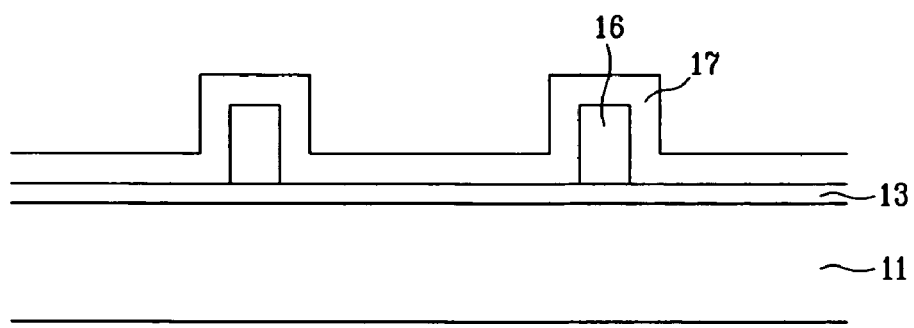

Subsequently, as shown in FIG. 3, polysilicon is deposited above the entire surface of the silicon wafer 11 to form a polysilicon layer 17.

Figure 4:
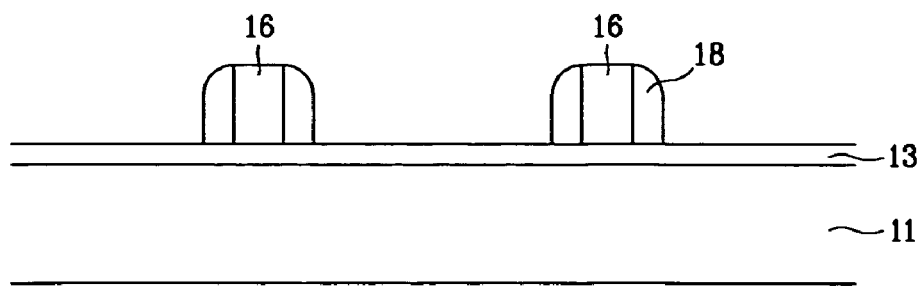

Subsequently, as shown in FIG. 4, the polysilicon layer 17 is vertically etched by a dry etching method until the auxiliary pattern 16 for the side walls is exposed. As a result, side walls 18 made of polysilicon are formed at lateral sides of the auxiliary pattern 16.

Figure 5:
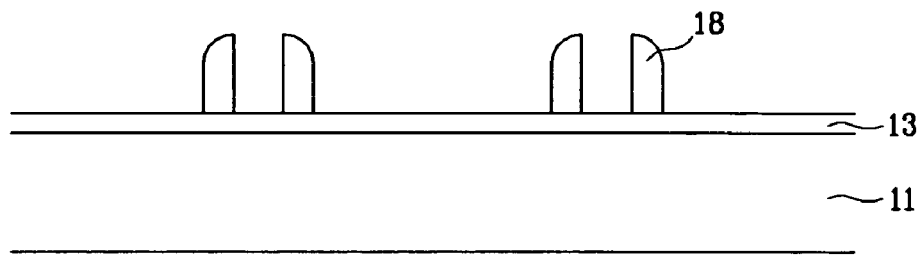

Subsequently, as shown in FIG. 5, the auxiliary pattern 16 for the side walls is removed by either a dry etching or a wet etching process having higher etching selectivity with respect to the side walls 18 and the auxiliary pattern 16.

Figure 6:
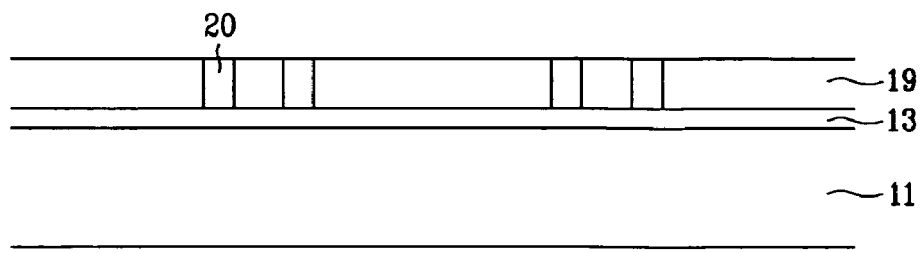

As shown in FIG. 6, a silicon oxide or a silicon nitride layer is deposited above the silicon wafer 11 to form an insulating layer 19. In the illustrated example, the insulating layer 19 is preferably formed thicker than the side walls 18. Subsequently, the semiconductor device is chemically mechanically polished to a degree that it is slightly further etched after the side walls 18 are exposed, (i.e., to a degree that the insulating layer 19 is slightly over-etched by chemical mechanical polishing such that a predetermined thickness of the insulating layer 19 is removed) to realize uniformity in the height and width of the gate electrodes 20. The gate electrodes 20 are then completed by partially removing upper portions of the side walls 18 by etching.

Subsequently, the insulating layer 19 is selectively etched so as to leave only the gate electrodes 20 above the silicon wafer 11.

Conventional processes well known to persons of ordinary skill in the art are then performed to complete the semiconductor device. For example, for a MOS transistor, impurity ions of low concentration are implanted into the exposed silicon wafer 11 using the gate electrodes 20 of the polysilicon as a doping mask, to form an LDD region (not shown). Then, side walls (not shown) of a nitride layer are formed to lateral sides of the polysilicon gate electrodes 20. Subsequently, using the side walls and the polysilicon gate electrodes 20 as a mask, impurity ions of high concentration are implanted into the exposed silicon wafer 11 so as to form source and drain regions.

As describe above, in the illustrated example, gate electrodes 20 are formed from side walls 18 made by depositing polysilicon. As a result, gate electrodes having a fine width may be easily achieved. The gate width may be adjusted by adjusting a deposition thickness of the insulating layer 15 for the side walls 18, which is obvious to a person of ordinary skill in the art. Accordingly, a very fine gate, such as a nanogate, may be easily realized. Therefore, more highly integrated devices can be easily manufactured, thereby meeting the requirements of a technical trend.

From the foregoing, persons of ordinary skill in the art will readily appreciate that methods of manufacturing a gate electrode 20 of a semiconductor device have been provided which more easily achieve a nanogate due to the reduced size of the gate electrode.

In a disclosed example manufacturing method, a gate electrode 20 is formed from a side wall 18 made of polysilicon. In this example, a gate oxide layer 13 and a sacrificial buffer layer 15 are sequentially formed on a semiconductor substrate 11 defined as an active region of the device. An auxiliary pattern 16 is formed by patterning the sacrificial buffer layer 15.

Then, polysilicon side walls 18 are formed adjacent the auxiliary pattern(s) 16, by depositing a polysilicon layer 17 above the substrate and thereafter dry etching the polysilicon layer 17. Subsequently, an insulating layer 19 is deposited above the substrate after removing the auxiliary pattern(s) 16.

The gate electrode(s) are completed from the side wall(s) 18 by removing a predetermined thickness of the side wall(s) 18 and the insulating layer 19 via chemical mechanical polishing.

Finally, the insulating layer 19 is removed, and subsequent conventional processes for manufacturing a semiconductor device are performed to finalize the semiconductor device.

The width of the gate electrode may be adjusted by adjusting a thickness of the sacrificial oxide layer 15. The sacrificial buffer layer may be formed as an oxide layer.

It is noted that this patent claims priority from Korean Patent Application Serial Number 10-2004-0039612, which was filed on Jun. 1, 2004, and which is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for manufacturing a gate electrode of a semiconductor device, comprising:

sequentially forming a gate oxide layer and a sacrificial buffer layer on a semiconductor substrate;

patterning the sacrificial buffer layer to form an auxiliary pattern;

depositing a polysilicon layer;

dry etching the polysilicon layer to form a side wall of the polysilicon layer to adjacent the auxiliary pattern;

removing the auxiliary pattern;

depositing an insulating layer;

chemical mechanical polishing to remove a predetermined thickness of the side wall and the insulating layer to thereby complete the gate electrode from the side wall; and removing the insulating layer.

2. A method as defined in claim 1, wherein a width of the gate electrode is adjusted by adjusting a thickness of the sacrificial buffer layer.

3. A method as defined in claim 1, wherein the sacrificial buffer layer is an oxide layer.

4. A method as defined in claim 2, wherein the sacrificial buffer layer is an oxide layer.

* * * * *